(12) United States Patent
Gaucher et al.

(10) Patent No.: US 7,295,161 B2
(45) Date of Patent: Nov. 13, 2007

(54) APPARATUS AND METHODS FOR CONSTRUCTING ANTENNAS USING WIRE BONDS AS RADIATING ELEMENTS

(75) Inventors: Brian Paul Gaucher, Brookfield, CT (US); Duixian Liu, Yorktown Heights, NY (US); Ullrich Richard Rudolf Pfeiffer, Carmel, NY (US); Thomas Martin Zwick, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/912,959

(22) Filed: Aug. 6, 2004

(65) Prior Publication Data

US 2006/0028378 A1    Feb. 9, 2006

(51) Int. Cl.
    *H01Q 1/38*    (2006.01)
(52) U.S. Cl. .............................. 343/700 MS; 343/872; 343/895; 340/572.7; 235/492
(58) Field of Classification Search ......... 343/700 MS, 343/872, 895, 866, 867; 340/572.7; 235/487, 235/492
    See application file for complete search history.

(56) References Cited

U.S. PATENT DOCUMENTS

| | | | |
|---|---|---|---|
| 3,940,046 A | 2/1976 | Fern ............................ | 219/85 |
| 5,682,143 A | 10/1997 | Brady et al. ................. | 340/572 |
| 5,972,156 A * | 10/1999 | Brady et al. ................. | 156/280 |
| 6,373,447 B1 * | 4/2002 | Rostoker et al. ............ | 343/895 |
| 6,885,354 B2 * | 4/2005 | Takei .......................... | 343/870 |
| 6,900,767 B2 * | 5/2005 | Hattori ........................ | 343/702 |
| 6,910,636 B2 * | 6/2005 | Kim et al. ................... | 235/492 |
| 6,967,282 B2 * | 11/2005 | Tonomura et al. .......... | 174/392 |
| 2004/0245651 A1* | 12/2004 | Nishisako et al. ........... | 257/777 |
| 2005/0139981 A1* | 6/2005 | Kobayashi et al. ......... | 257/690 |

FOREIGN PATENT DOCUMENTS

| | | |
|---|---|---|
| EP | 0 977 145 A2 | 2/2000 |
| EP | 1 069 645 A2 | 1/2001 |
| JP | 11-306306 | 11/1999 |
| JP | 2002141722 A * | 5/2002 |
| WO | WO 96/13793 | 5/1996 |
| WO | WO 9613793 A1 * | 5/1996 |

OTHER PUBLICATIONS

Patent Abstract of Japan for publication No. 11306306, no dated provided!
International Search Report, no dated provided!

* cited by examiner

*Primary Examiner*—Tho Phan
(74) *Attorney, Agent, or Firm*—F. Chau & Associates, LLC; Frank V. DeRosa (57) ABSTRACT

Antennas are provided which are constructed using one or more wires as radiating elements attached to a substrate or chip, wherein wire bonding methods can be used to attach and form loop profiles for the wires. The antennas can be integrally packaged with IC chips (e.g., IC transceivers, receivers, transmitters, etc.) to build integrated wireless or RF (radio frequency) communications systems.

28 Claims, 9 Drawing Sheets

APPARATUS AND METHODS FOR CONSTRUCTING ANTENNAS USING WIRE BONDS AS RADIATING ELEMENTS

TECHNICAL FIELD OF THE INVENTION

The present invention relates generally to apparatus and methods for constructing antenna devices using one or more wires as radiating elements attached to a substrate or chip, wherein wire bonding methods can be used to attach and form loop profiles for the wires. In addition, the invention relates to apparatus and methods for building fully integrated wireless or RF (radio frequency) communications systems by integrally packaging antennas formed with radiating wire elements together with IC (integrated circuit) chips.

BACKGROUND

To provide wireless connectivity and communication between devices in a wireless network such as a wireless PAN (personal area network), a wireless LAN (local area network) a wireless WAN (wide area network), a cellular network, or virtually any radio network or system), it is necessary to equip the receivers and transmitters (or tranceivers) with antennas to efficiently radiate (transmit) or receiver the desired signals to/from other elements of the network.

With conventional radio communication systems, such as millimeter-wave radio communication systems, discrete components are encapsulated or mounted individually with low integration levels on a printed circuit board, package or substrate. For millimeter-wave applications, these radio communications systems are typically built using expensive and bulky wave guides, package-level or board-level microstrip structures, as well as wire bonds to interconnect semiconductor chips and transmitter or receiver antennas.

SUMMARY OF THE INVENTION

Exemplary embodiments of the invention include apparatus and methods for constructing antenna devices using one or more wires as radiating elements attached to a substrate or chip. In one exemplary embodiment, wire bonding methods are used for attaching wires to the substrate or chip and forming loop profiles for the wires. Antennas according to exemplary embodiments of the invention can be constructed with one or more wires (or wire bonds) as radiating elements to form various types of antennas including monopole antennas, dipole antennas, folded dipole antennas, loop antennas, or end-fire antenna arrays, or other types of antenna arrays.

Exemplary embodiments of the invention further include apparatus and methods for building fully integrated wireless or RF (radio frequency) communications systems by packaging one or more antennas, which are formed with radiating wire elements, together with IC (integrated circuit) chips. Indeed, antennas formed with radiating wire or wire bond elements can be directly attached to an on-chip RF (radio frequency) or microwave integrated circuit (e.g., receiver, transmitter, transceiver, etc.) and packaged in a plastic/dielectric encapsulant to construct fully integrated RF or wireless communications devices.

These and other exemplary embodiments, aspects, objects, features and advantages of the present invention will be described or become apparent from the following detailed description of exemplary embodiments, which is to be read in connection with the accompanying drawings.

DETAILED DESCRIPTION OF EXEMPLARY EMBODIMENTS

Exemplary embodiments of the invention as described herein include apparatus and methods for constructing antennas using one or more wire elements as radiating elements attached to the surface of a substrate or semiconductor chip. In one embodiment of the invention, the wires comprise wire bonds that are formed using wire bond methods to attach wires to a substrate or chip and form the desired wire loop profiles. Antenna devices according to exemplary embodiments of the invention which are formed with wire bond radiating elements utilize wire loop profiles that are feasible and consistent with the limitations of current (or future) bonding technologies in terms of wire dimensions, precision and motion contours, for example. Moreover, the use of wire bonding methods to form wires as radiating elements enables accurate placement and repeatability for high volume manufacturing of antenna devices according to the invention. A brief description of wire bonding methods and the use of such methods for constructing antenna devices according to exemplary embodiments of the invention will now be provided.

In general, wire bonding is a method that is commonly used in semiconductor fabrication for making chip-to-substrate interconnections to provide electrical paths for power and signal distribution. As is known in the art, wire bonding generally involves connecting pads on a die to a lead frame (or substrate) using very fine diameter wire. In general, there are several wire bonding methods that can be implemented, which are known as "ball bonding" and "wedge bonding" methods. The basic steps for both types of wire bonding methods include (i) forming a first bond (normally on the chip), (ii) forming a wire loop, and (iii) forming a second bond (normally on the substrate).

There are various differences between ball bonding and wedge bonding techniques. One difference is that in "ball bonding", a free air ball is formed at the beginning of each bond cycle and the first bond is achieved by bonding the ball to the pad, whereas in "wedge bonding", a wire is bonded directly to a device using force and ultrasonic energy. For ball bonding, bond wire formed of gold (Au) wire having a purity of at least 99.99% is typically used. Alternatively, copper (Cu) wires can be ball bonded by making some modifications to a wire bond device. In such a case, a gas environment is formed to prevent Cu oxidation during the free air ball formation. Both Au and Cu bonding are performed at elevated temperatures, a process referred to as "thermosonic bonding" because it employs heat and ultrasonic energy. For wedge bonding, wire bonds could be formed using Au wire at elevated temperatures or using aluminum (Al) wire at room temperature.

Another difference between ball bonding and wedge bonding is with respect to wire looping. The loop of a wire bond refers to the curve or arc of the wire between the attachment points at each end of a wire bond. In particular, ball bonding places no restrictions on the direction for looping a wire from the first bond to the second bond, which renders ball bonding looping extremely flexible. On the other hand, conventional wedge bonding equipment only allows bonds to be placed parallel to the wire direction. Another difference between ball bonding and wedge bonding is that the speed of bonding using ball bonding can be more than twice the speed of the fastest wedge bonder.

In accordance with the invention, depending on the application or antenna design, ball bonding or wedge bonding methods can be used for forming wire bonds as radiating elements on a substrate or chip. Due to the higher speed, lower cost, and more flexible looping capability, ball bonding is the most commonly used interconnect method today. However, for fine pitch applications, when selecting between ball bonding or wedge bonding, several factors including achieving small, reliable bonds, maintaining loops, and positioning the bond accurately, should be considered.

TABLE I below lists typical specifications for fine pitch wire bonding applications, which can be achieved using currently existing wire bonding tools (e.g., wire bonder).

TABLE I

| PARAMETERS | TYPICAL VALUES |
| --- | --- |
| Bond Pitch ($B_p$) | 35-45 microns |
| Minimum Wire Diameter ($W_D$) | 15-25.4 microns |
| Wire Sway | +/−1 Wire Diameter |
| Maximum Wire Bond Length ($L_w$) | 7.6 mm |
| High Precision Wire Spans | <2.4 mm |
| 3σ Placement Accuracy (PA) | +/−5 microns |
| Minimum Loop Height (LH) | 100 microns |
| Minimum Ball Diameter ($B_D$) | 43 microns |

Figure 1:
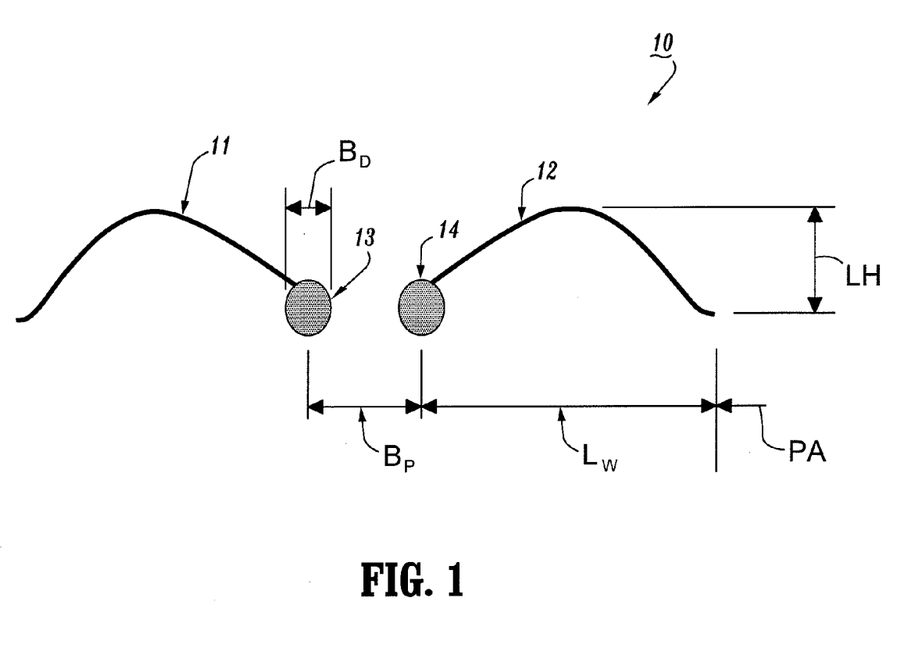
FIG. 1 schematically illustrates an antenna that comprises wires as radiating elements, which can be designed in accordance with specifications for a fine pitch wire bonding methods, according to an exemplary embodiment of the invention.

FIG. 1 schematically illustrates an antenna that comprises wires as radiating elements, which can be designed using fine pitch wire bonding methods in accordance with the specifications as listed in Table I, according to exemplary embodiments of the invention. More specifically, FIG. 1 schematically illustrates a dipole antenna (10) comprising a half-wavelength dipole element comprising first and second quarter-wave wire elements (11) and (12) which are connected to respective ball bonds (13) and (14). In FIG. 1, it is assumed that the ball bonds are bonded to pad connections of a feed network (e.g., differential feed network) and the opposite ends of the wires (11) and (12) are connected to a substrate or chip (as explained below with reference to FIGS. 2A, 2B and 3, for example).

As depicted in FIG. 1, wire bonding tools for fine-pitch ball and wire bonding are capable of producing a bond pitch ($B_P$) (spacing between wire bonds on a chip, for example) of 35-45 microns (and a minimum 35 micron ball bond pitch ($B_P$) for ball bonding), a minimum wire diameter of 15-25.4 microns, a wire sway of ±1 wire diameter for high precision wire spans of less than 2.4 mm, a 3σ standard deviation) placement accuracy (PA) of ±5 microns, a maximum wire bond length ($L_W$) of 7.6 mm, a minimum wire loop height (LH) of 100 microns, and a minimum ball diameter ($B_D$) of 43 microns. As explained below, these wire bond specifications are suitable for constructing antenna devices with wire bonds as radiating elements for millimeter wave applications.

Moreover, for defining a wire loop profile, current wire bonding tools allow several wire loops to be programmed, e.g. J-wire loop, RF loop, spinder loop profile, etc. Most of the available loop profiles are derived with experimental statistical methods applied to the possible motion contours of a wire bonding tool tip. Typically, known and commonly used shapes/contours/loop profiles are related to a specific package type or chip attachment technique to provide the shortest wire bond possible and/or smallest bonding pitch without necking the wire.

Bonding wire profile limitations can be analyzed by modeling a wire bond as a plurality of sets of corresponding linkage/spring pairs, which are combined to form a wire bond, wherein the coefficients of elasticity and plasticity of the springs are determined by the bending angle of two linkages, which simulates the elastic-plastic deformation of the bonding wires. These studies can be used to illustrate that there are a variety of wire loop profiles, which are not desirable for chip-to-substrate interconnects, but which are suitable and effective as radiating elements for antennas in accordance with exemplary embodiments of the invention. Manual wire bonders can be used to exploit the contour motions process to achieve wire loop profiles which comply with the capabilities of automated fine-pitch wire bonding tools. Exemplary embodiments of the invention as described herein utilize wire loop profiles that are feasible and consistent with the limitations of a wire bonding technology in terms of wire dimensions, precision and motion contours.

Figure 2A:
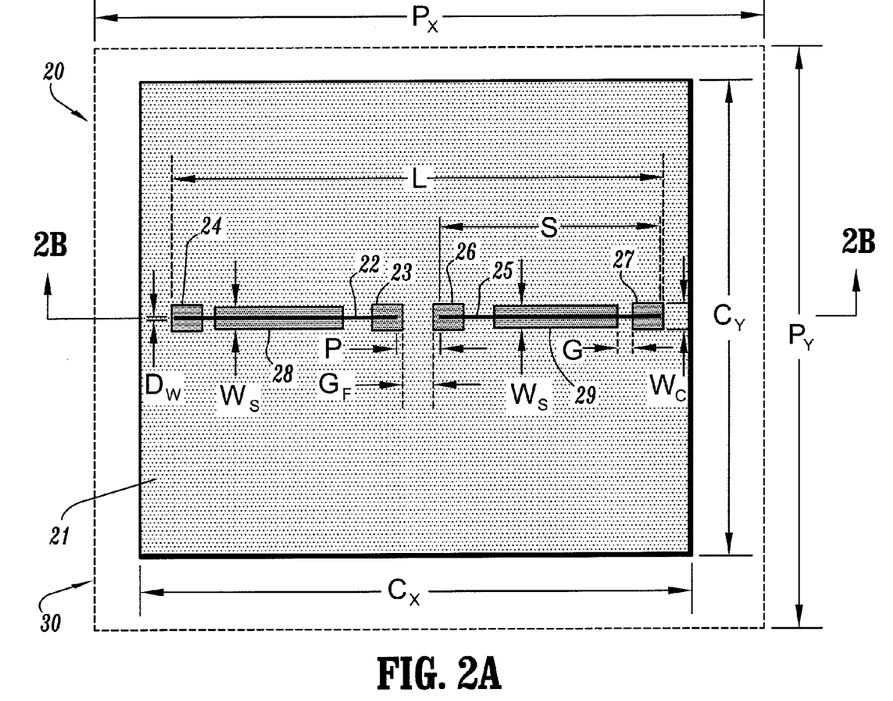
FIG. 2A is a schematic plan view of an antenna according to an exemplary embodiment of the invention.
Figure 2B:
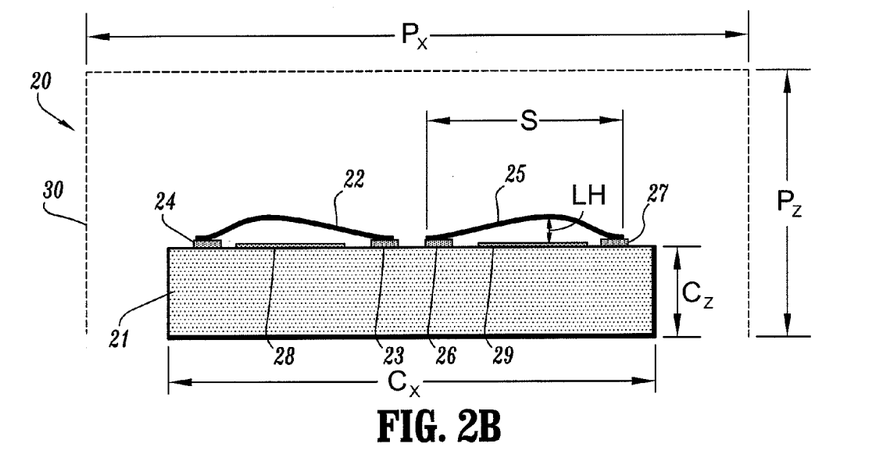
FIG. 2B is a schematic cross-sectional side view of the exemplary antenna depicted in FIG. 2A taken along line 2B-2B.

FIGS. 2A and 2B are schematic diagrams illustrating an antenna device according to an exemplary embodiment of the present invention. More specifically, FIGS. 2A and 2B illustrate an exemplary embodiment antenna device (20) comprising a dipole antenna formed with wire bonds as radiating elements, wherein FIG. 2A schematically illustrates a top plan view of the antenna device (20) and FIG. 2B is a schematic cross-sectional view of the antenna device (20) of FIG. 2A taken along line 2B-2B. For illustrative purposes, exemplary embodiments of the invention will be described with specific reference to dipole antenna devices and integration of such devices in semiconductor IC packages. It is to be understood, however, that the present invention is not limited to any particular antenna type or operating frequency. Rather, the invention is more generally applicable to any antenna type that is suitable for a given application and/or frequency of operation, which can be designed using wires as radiating elements formed with wire bonding methods, for example.

Referring now to FIGS. 2A and 2B, an exemplary antenna device (20) comprises a substrate (21) (or chip (die)) having a dipole antenna structure based on the exemplary framework of FIG. 1. More specifically, the dipole antenna comprises a first wire element (22) connected to and supported by metallic pads (23) and (24), and a second wire element (25) connected to and supported by metallic pads (26) and (27). The first and second wire elements (22) and (25) are first and second quarter-wave wire elements, respectively. In the exemplary embodiment of FIGS. 2A and 2B, the metallic pads (23) and (26) are contact pads to an integrated antenna feed network connected to an RF circuit. The metallic pads (24) and (27) are termination pads for attaching and supporting the end (non-fed) portions of respective wire elements (22) and (25). Each wire has a starting and end point where it is connected and supported.

The exemplary antenna device (20) further comprises optional metallic shielding elements (28) and (29) formed on the substrate/chip (21) under respective wire elements (22) and (25). The metallic shielding elements (28) and (29) may be included between the substrate (21) and the wires (22) and (25) to prevent electromagnetic fields from penetrating into the substrate (21) thereby reducing loss and improving the antenna efficiency. The contact pads (23), (24), (26) and (27) and shielding elements (28) and (29) can be formed as part of the top metallization layer of the substrate/chip (21).

Depending on the antenna implementation, the substrate/chip (21) may comprise any suitable material including, for example, dielectric/insulative materials such as fused silica ($SiO_2$), alumina, polystyrene, ceramic, teflon based substrates, FR4, etc., or semiconductor materials such as high resistivity silicon or GaAs, etc.

Further, the exemplary antenna device (20) comprises an antenna encapsulation layer (30) for environmental protection, which is shown in FIGS. 2A and 2B in phantom (dotted lines). Depending on the application, the encapsulation layer (30) may be a package cover (plastic cover) that encapsulates the antenna and substrate/chip. In particular, by way of example, for packaging the substrate/chip (21) with the antenna connected thereto inside a chip package, the chip and antenna can be encapsulated in a low cost plastic package. In other embodiments, a layer of dielectric material may be formed over the substrate/chip (21) such that the antenna wire elements are embedded within such layer.

In accordance with an exemplary embodiment of the invention, the wire elements (22) and (25) are attached to the substrate/chip (21), and the loop profiles of such wire elements are formed, using a wire bonding machine, which enables accurate placement and repeatability for high volume manufacturing. In this regard, loop profiles according to exemplary embodiments of the invention can be programmed to the wire bonder using known techniques to provide an optimum/desired radiation efficiency for a given antenna type.

FIGS. 2A and 2B illustrate various parameters and/or dimensions for the exemplary dipole antenna device (20), which can be varied depending on the application, antenna type, and/or frequency of operation, for example. In particular, the substrate/chip (21) is depicted as substantially square-shaped with area dimensions ($C_X$) and ($C_Y$) and with a thickness of ($C_Z$). Moreover, the encapsulant/cover (30) is depicted as having dimensions ($P_X$), ($P_Y$) and ($P_Z$). The wire elements (22) and (25) are depicted as each having a wire diameter ($D_W$), a lateral span (S), and feed points separated by pitch (P). The metallic contact pads (23), (24), (26), and (27) are depicted as having a width ($W_C$) and the metallic shields (28) and (29) are depicted as having a width ($W_S$). The termination pads (24) and (27) are depicted as being separated with a lateral extension (L) across the substrate/chip (21). The feed pads (23) and (26) are depicted as being separated by a gap ($G_F$) and the metallic shields and contact pads are depicted as being separated with a gap (G). Moreover, the wire elements (22) and (25) are depicted as having a loop height (LH) over the respective metallic shields (28) and (29).

The following Table II lists exemplary values for the above parameters/dimensions for a 60 GHz dipole antenna design based on the framework of FIGS. 2A and 2B, according to an exemplary embodiment of the invention.

TABLE II

| PARAMETER | EXEMPLARY VALUE |
| --- | --- |
| Chip/Substrate Dimension ($C_X$) | 2.5 mm |
| Chip/Substrate Dimension ($C_Y$) | 2.5 mm |
| Chip/Substrate Dimension ($C_Z$) | 300 microns |
| Wire Span (S) | 1012.5 microns |
| Wire Loop Height (LH) | 100 microns |
| Wire Pitch (P) | 175 microns |
| Wire Diameter ($D_W$) | 25.4 microns |
| Wire Feed Gap ($G_F$) | 50 microns |
| Lateral On-Chip Antenna Extension (L) | 2300 microns |
| Encapsulant Dimension ($P_X$) | 5 mm |
| Encapsulant Dimension ($P_Y$) | 5 mm |
| Encapsulant Dimension ($P_Z$) | 800 microns |
| Width of Contact Pads ($W_C$) | 100 microns |
| Width of Shields ($W_S$) | 300 microns |
| Gap between Contact Pads /Shields (G) | 50 microns |

For an exemplary dipole antenna embodiment having a framework as depicted in FIGS. 2A and 2B and parameter values as listed in Table II, the loop height (LH) of 100 μm is suitable for implementation with a chip and package having the listed dimensions.

Figure 3:
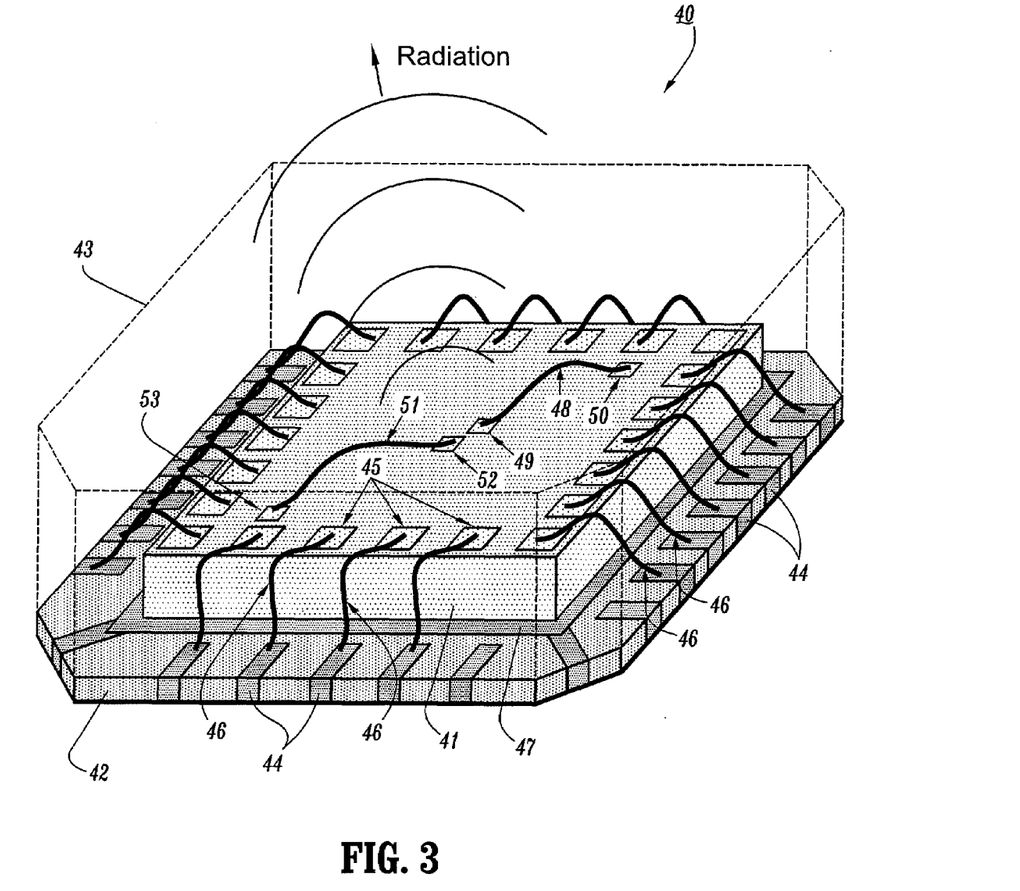
FIG. 3 is a schematic perspective view of an apparatus for integrally packaging an antenna and IC (integrated circuit) chip, according to an exemplary embodiment of the present invention.

It is to be appreciated that antennas according to exemplary embodiments of the invention can be integrally packaged with IC chips in relatively small packages to construct RF or wireless communications chips. For example, FIG. 3 is a schematic perspective view of an apparatus (40) for integrally packaging an antenna and IC chip, according to an exemplary embodiment of the present invention. In particular, FIG. 3 illustrates a fully integrated on-chip dipole antenna having a framework similar to that discussed above with reference to the exemplary embodiments of FIGS. 2A and 2B, which is packaged with an IC chip using a low cost QFN (Quad Flat Nonleaded) package structure.

In particular, referring to FIG. 3, the apparatus (40) comprises an IC chip (41) surface mounted to a leadless (ceramic) chip carrier (42), and a package encapsulation (43) (package cover) depicted in phantom (dotted lines) that encapsulates the IC package, which can be formed of a low-cost plastic material. The chip carrier (42) comprises a lead frame having plurality of pads (44) formed on all four sides of the carrier substrate (42). The chip (41) (or die) comprises a plurality of bond pads (45) (or metallized regions) distributed around the perimeter of the active surface of the chip (41). The bond pads (45) are connected to the lead frame pads (44) with wires (46) formed via wire bonding, for making electrical connections (e.g., ground, power, I/O, etc.) between the IC chip (41) and the package contacts (44). The chip carrier (42) further comprises a die paddle (47) to which the die (41) is attached.

In addition, the apparatus (40) comprises a dipole antenna having a framework similar to the dipole antenna discussed above with reference to FIGS. 2A and 2B. In particular, the exemplary dipole antenna in FIG. 4 comprises a first wire element (48) connected to and supported by metallic pads (49) and (50), and a second wire element (51) connected to and supported by metallic pads (52) and (53). The first and second wire elements (48) and (51) are first and second quarter-wave wire elements, respectively. The metallic pads (49) and (52) are contact pads to an integrated antenna feed network connected to an RF circuit. The metallic pads (50) and (53) are termination pads for attaching and supporting end (non-fed) portions of respective wire elements (48) and (51).

The contact pads (49) and (52) enable connection of the dipole antenna to an integrated antenna feed network (differential feed), which is connected to an integrated circuit of the chip (41). The feed network framework will vary depending on, e.g., the impedance that is desired for the given application and/or the type of devices to which the antenna will be connected. For example, if the antenna is connected to a transmitter system, the feed network will be designed to provide the proper connections and impedance matching for a power amplifier. By way of further example, if the antenna is connected to a receiver system, the feed network will be designed to provide the proper connections and impedance matching for a LNA (low noise amplifier).

The exemplary apparatus (40) may further comprise metallic shielding elements formed on the chip (41) under wire elements (48) and (51) to prevent electromagnetic fields from penetrating into the substrate (41), depending on the substrate loss and its dielectric constant. The size of the ground shields can influence the radiation efficiency of the antenna and will be limited by the overall chip geometry.

It is to be understood that the exemplary embodiment of FIG. 3 is merely one illustrative embodiment of a fully integrated on-chip antenna, and that one of ordinary skill in the art can readily envision other frameworks based on the teachings herein. For example, antenna structures other than dipole antennas can be formed with wire bonds and packaged as described above. Indeed, FIGS. 8A~8D described below schematically illustrate various antennas that can be built using wire bonds according to exemplary embodiments of the invention. Moreover, although one antenna is depicted in FIG. 3, IC packages according to other exemplary embodiments of the invention may be built with two antennas, wherein one antenna is connected to an integrated transmitter circuit for transmitting and another antenna is connected to an integrated receiver circuit for receiving, for example. Moreover, although FIG. 3 depicts the wire termination contacts (50) and (53) located on the surface of the chip (41), antennas can be formed with wire terminations located on a package lead (44) if larger wire spans are considered. Indeed, one or more lead wires can also be used as radiating elements of an antenna.

Figure 4:
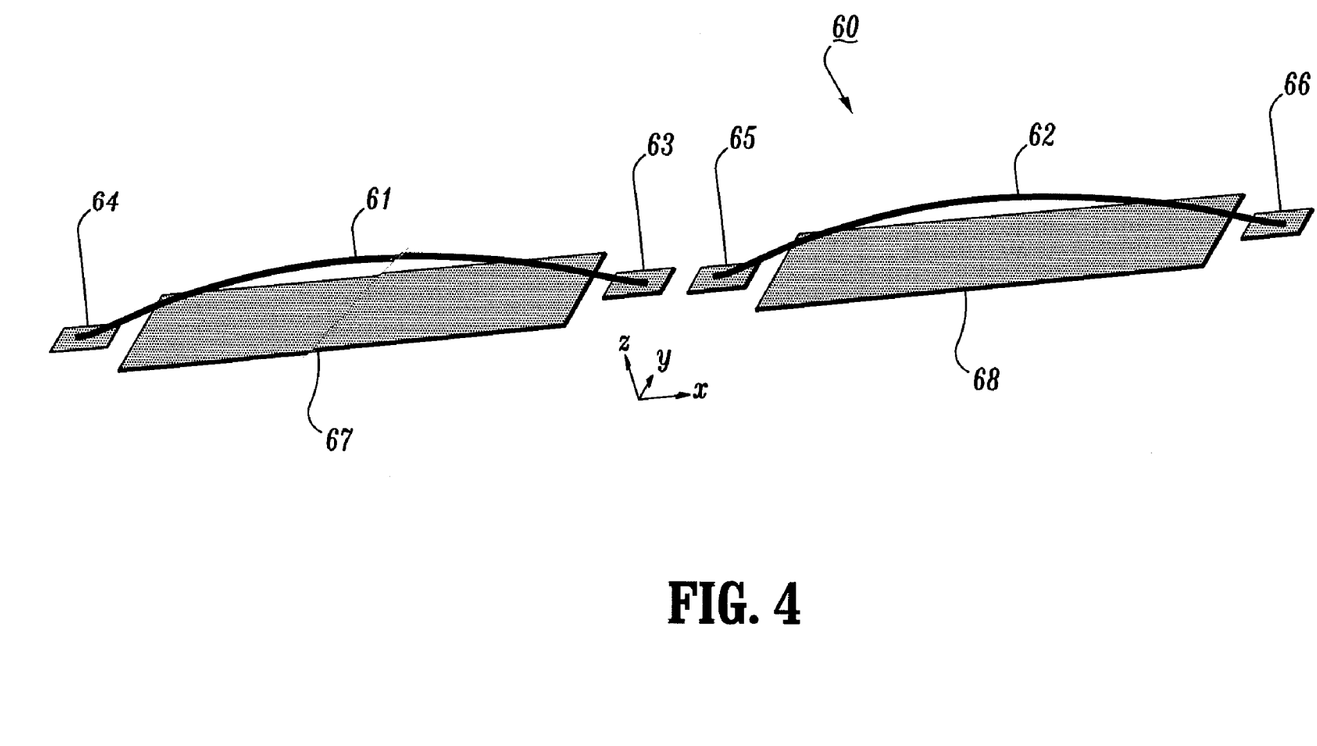
FIG. 4 depicts a computer model of a dipole antenna according to an exemplary embodiment of the invention.

For purposes of determining electrical properties and characteristics of an antenna design using wire bonds as radiating elements according to the invention, computer simulations were performed for 60 GHz dipole antenna design using the commercially available and well-known IE3D EM (electromagnetic) simulation software, which is an EM simulation software tool for RF, wireless, packaging, and optoelectronic design. In particular, simulations were performed for a model differential-fed dipole antenna (60) in an air (vacuum) environment as depicted in FIG. 4, with wire elements (61) and (62), contact pads (63), (64), (65) and (66) and metallic shields (67) and (68). The wire, pads and shield parameters set forth in TABLE II above were specified for the model dipole antenna (60), e.g., a 100 micron loop height, a loop span (S) of 1012.5 microns, and shields of 300 microns in width, etc.

Figure 5:
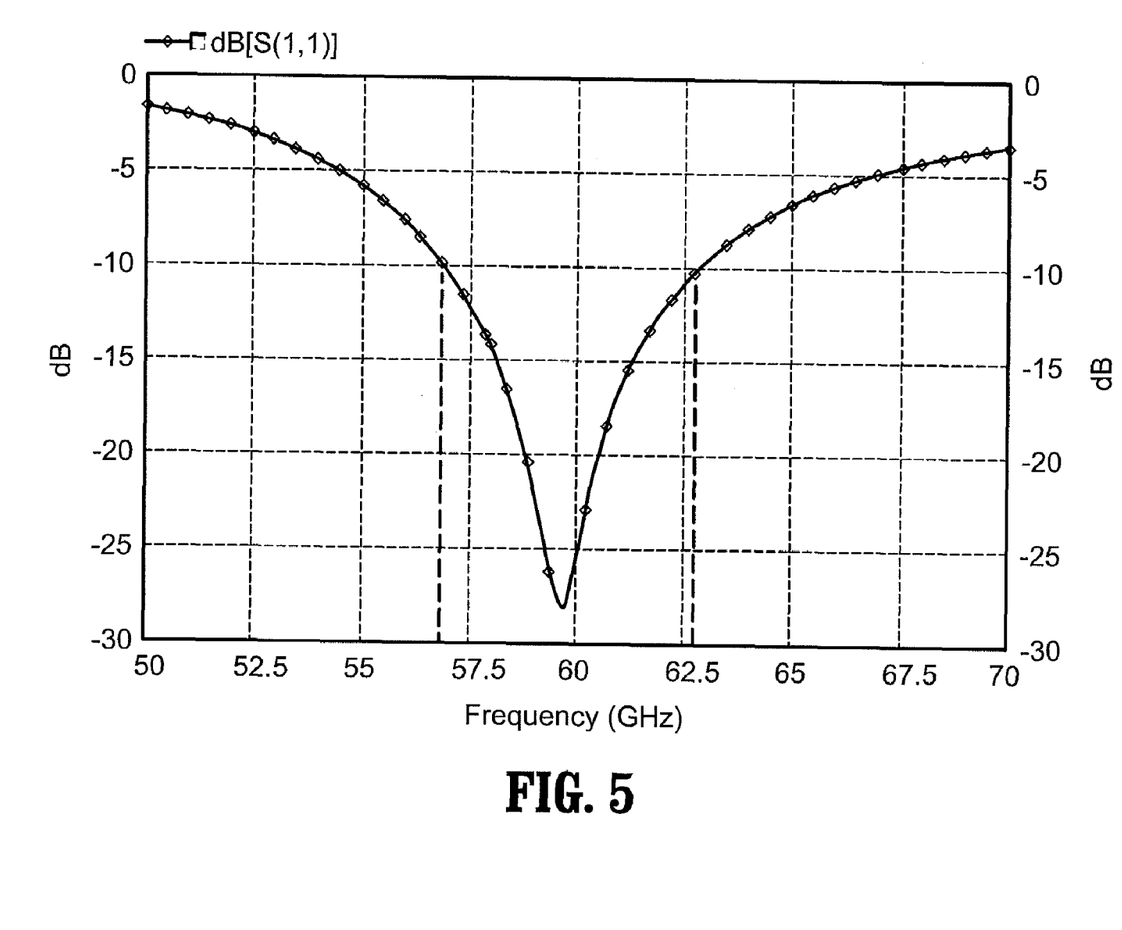
FIG. 5 graphically illustrates a simulated return loss of the model dipole antenna of FIG. 4.
Figure 6:
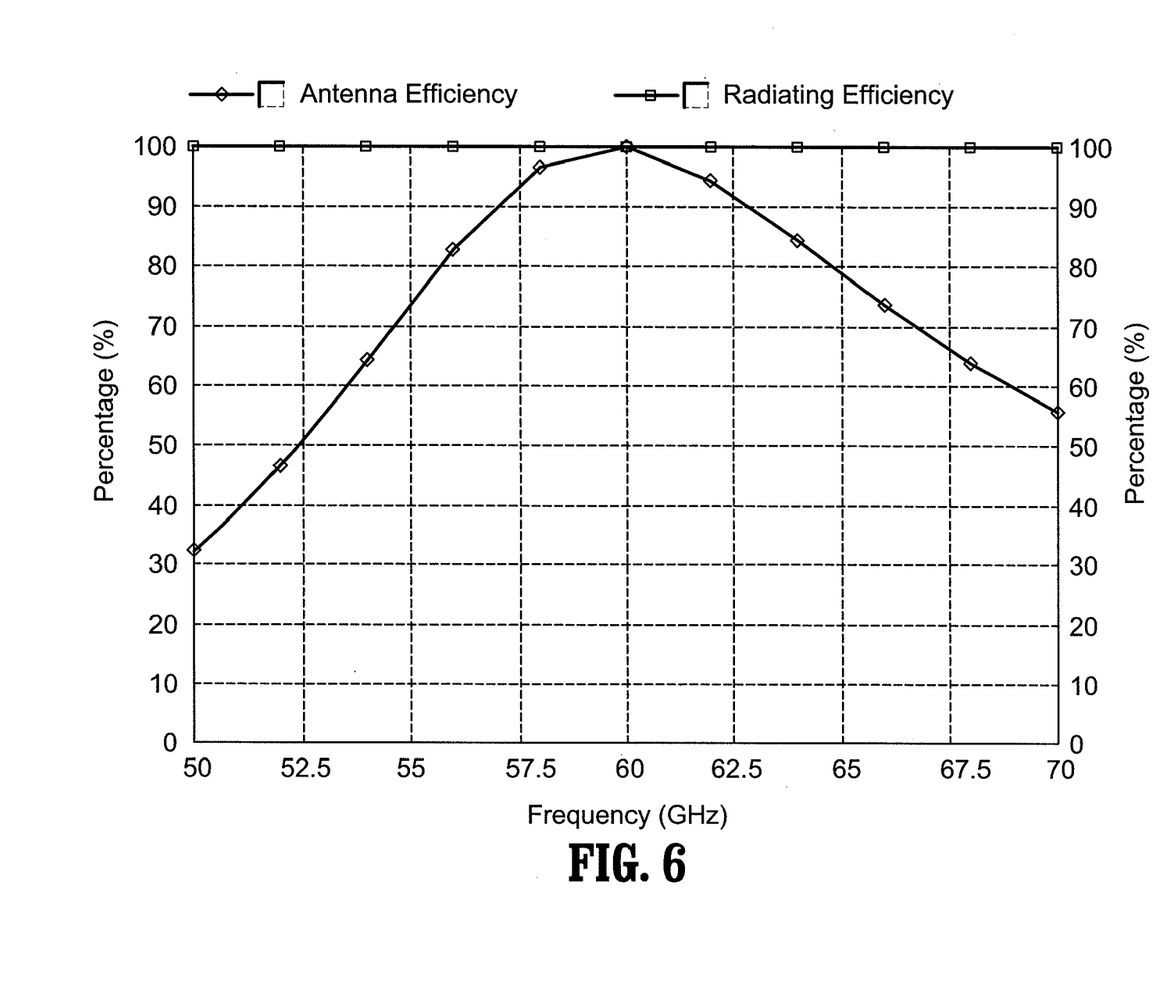
FIG. 6 graphically illustrates the simulated antenna and radiation efficiency of the model dipole antenna of FIG. 4.

FIG. 5 graphically illustrates a simulated return loss of the model dipole antenna (60) in air of FIG. 4. In particular, FIG. 5 graphically illustrates the simulated input impedance match parameters (S11) in dB for the model 60 GHz dipole antenna. FIG. 5 illustrates that the exemplary dipole antenna embodiment provides a bandwidth of about 6 GHz at the 60 GHz frequency band, wherein the bandwidth is defined based on the frequency range for which $S_{11}$ was measured to be about −10 dB or better relative to a 75 Ohm feeding cable. Moreover, FIG. 6 graphically illustrates the simulated antenna and radiation efficiency of the model dipole antenna of FIG. 4. As noted above, depending on the substrate loss and its dielectric constant, a ground shield may be used to prevent the electromagnetic fields from reaching into the substrate and the size of such ground shields will influence the radiation efficiency.

Figure 7:
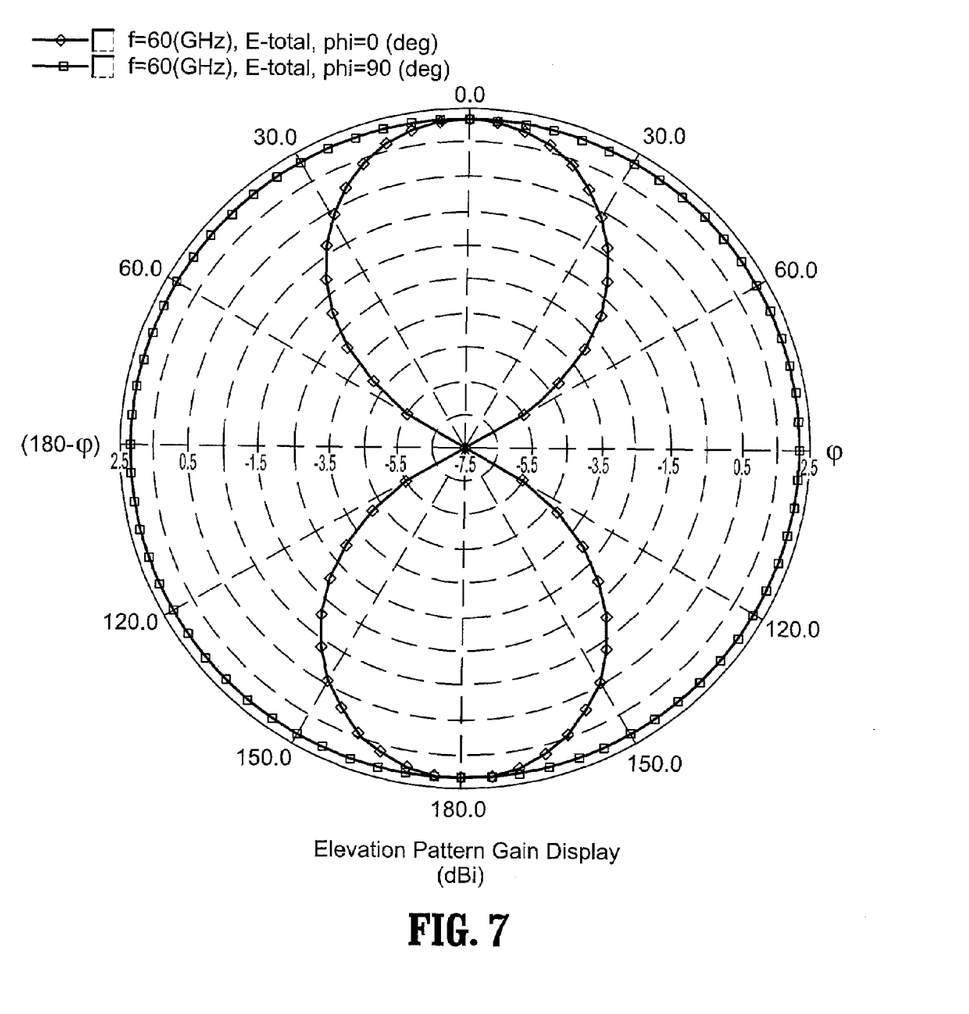
FIG. 7 graphically illustrates simulated radiation patterns of the model dipole antenna of FIG. 4.

FIG. 7 graphically illustrates (using a polar graph) the simulated elevation radiation patterns of the model 60 GHz dipole antenna of FIG. 4. The elevation radiation patterns depicted in FIG. 7 assume a Cartesian coordinate system as depicted in FIG. 4, wherein the Z-axis extends in a direction perpendicular to the plane of the antenna shields and pads, wherein the x-axis longitudinally extends along the plane of the antenna in a direction along axis of the dipole antenna, and wherein the y-axis longitudinally extends in a direction perpendicular to the axis of the dipole antenna. FIG. 7 depicts the elevation radiation patterns that were obtained in a vertical plane defined by the ZY plane (phi=90 degrees), and ZX plane (phi=0 degrees), which are typical for dipole antennas in general.

Moreover, the influence of the 3σ placement accuracy of a typical wire bonder has been simulated to predict an upper limit on the frequency shift due to longer wires. Simulations have shown that there is less than 1% shift in frequency due to such tolerances.

It is to be understood that the exemplary embodiments discussed above with reference to FIGS. 1, 2A, 2B, and 3, for example, are merely exemplary embodiments of antennas and IC packages according to the invention, and that one of ordinary skill in the art can readily envision other antenna types that can be constructed and packaged with IC chips using the devices and methods of the present invention. For example, besides the exemplary dipole antennas described herein, other antennas such as monopole, folded dipole, loop or end-fire antenna array structures, for example, can be constructed using wire elements according to the invention. Depending on the type of antenna, intermediate connections (contact pads) can be provided to form a meander wire structure on-chip.

Figure 8A:
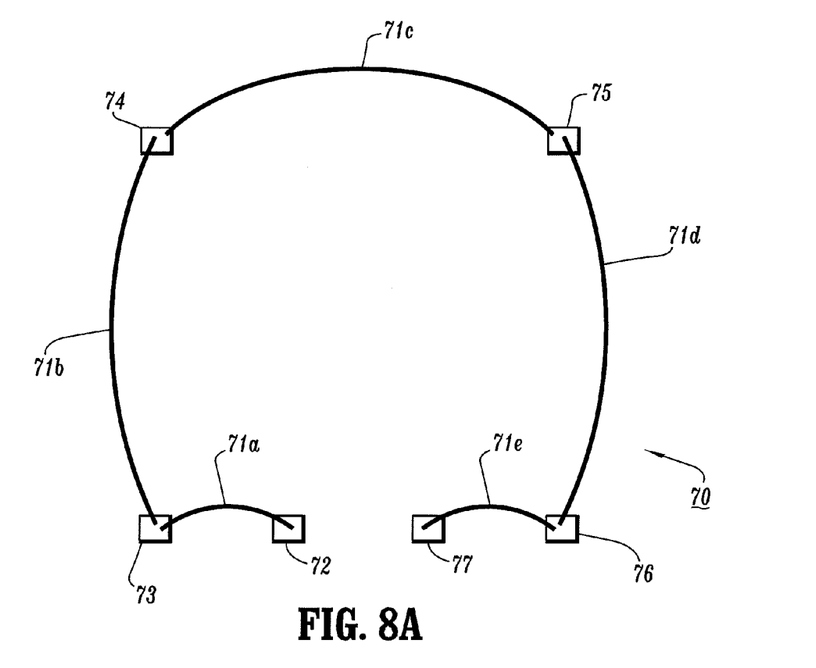
FIGS. 8A~8D are schematic illustrations of various types of antennas that can be formed using wire bonds, according to exemplary embodiments of the invention.

For example, FIGS. 8A~8D are schematic diagrams illustrating antennas that can be built using wire bonds, according to exemplary embodiments of the invention. The exemplary antenna frameworks depicted in FIGS. 8A~8D can be packaged with IC chips as discussed above with reference to FIG. 3, for example. In particular, FIG. 8A schematically illustrates a loop antenna (70) that is formed with a plurality of separate wire bond elements (71a~71e) arranged in a loop, which are connected to corresponding pads (72~77). In the exemplary embodiment of FIG. 8A, pads (72) and (77) are assumed to be feed points (e.g., differential feed) to a feed network. In addition, pads (73~76) are shown to be connection points for the various wire bond elements, which enable a meandering wire structure.

Figure 8B:
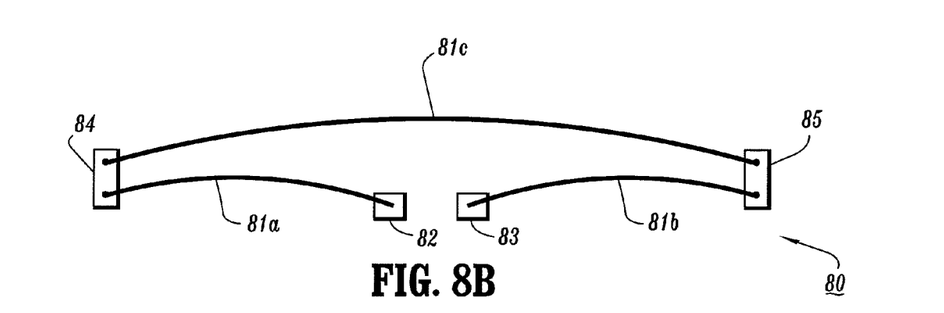

Moreover, FIG. 8B schematically illustrates a folded dipole antenna (80), which is formed using three wire bonds (81a, 81b, 81c) and pads (82~85). In the exemplary embodiment of FIG. 8B, the wire bond elements (81a) and (81b) are quarter-wave elements that comprise a first (fed) half-wavelength dipole element, and the wire bond element (81c) comprises a second half-wavelength dipole element. The first and second half-wavelength elements are disposed substantial parallel to each other and separated by a gap. The end portions of elements (81*a*) and (81*b*) are connected (shorted) to end portions of the second dipole element (81*c*) by contact pads (84) and (85).

Figure 8C:
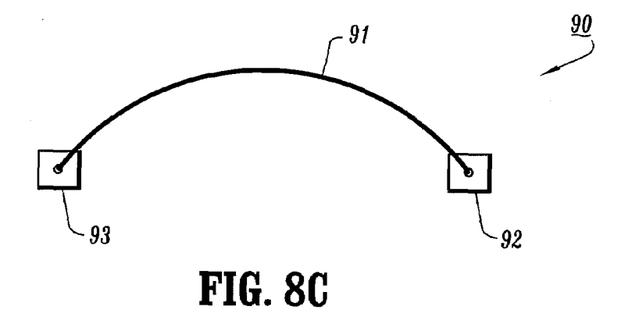

Next, FIG. 8C schematically illustrates a monopole antenna (90) according to an exemplary embodiment of the invention. The monopole antenna (90) is formed using one wire bond (91) attached to pads (92) and (93).

Figure 8D:
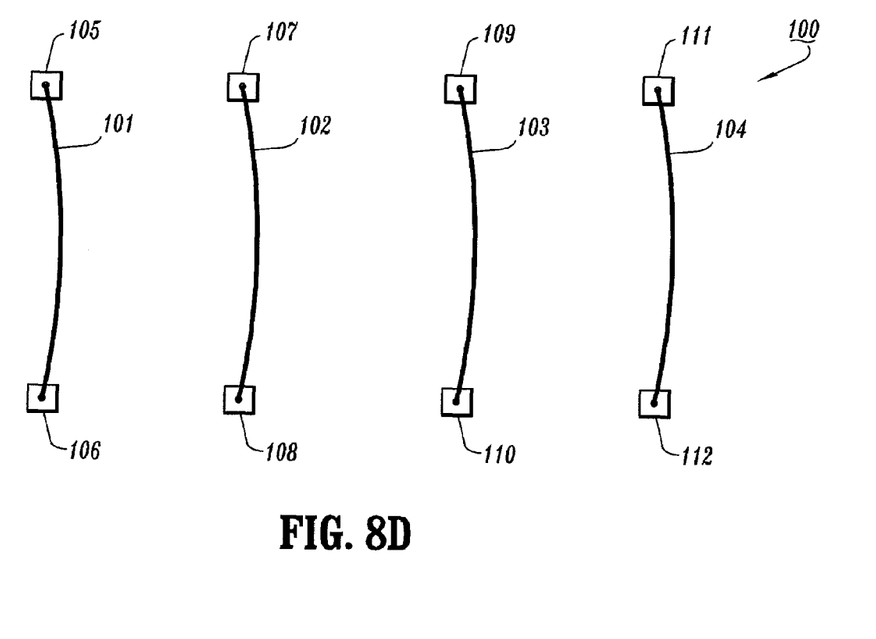

Further, FIG. 8D schematically illustrates an end-fire antenna array (100) according to an exemplary embodiment of the invention. The exemplary antenna (100) comprises a plurality of parallel half-wave elements (101~104) connected to respective pads (105~112). As with typical end-fire array structures, the elements (101~104) can be feed with current that is 180 degrees out of phase.

Those of ordinary skill in the art will readily appreciate the various advantages associated with antennas and integrated antenna packages according to embodiments of the invention. For instance, antenna devices according to exemplary embodiments of the invention can operate at RF and microwave frequencies, for example, while simultaneously providing antenna performance characteristics such as high gain/directivity/radiation efficiency, wide bandwidth, hemishperical or omnidirectional radiation patterns, impedance, etc., that render the antennas suitable for voice communication, data communication or radar applications, for example.

Moreover, exemplary antenna designs according to the invention enable high-volume antenna manufacturing capability. Moreover, integrated IC packages according to exemplary embodiments of the invention enable antennas to be integrally packaged with IC chips such as transceiver chips, which provide compact designs with very low loss between the transceiver and the antenna. Indeed, such IC package designs eliminate the need to go off the transceiver chip with high frequency input and output signals, thereby providing low loss designs.

Another advantage is that wire bond antenna designs and IC packages with such antennas provide radiation patterns that are very suitable to be placed in the center of a focusing antenna for directional antenna applications such as point-to-point systems or radar systems. Indeed, antennas and integrated antenna packages according to the present invention enable a multitude of applications such as integrated phased array antenna systems, personal area networks, radar feeds, high reliability due to redundancy, point-to-point systems, etc. Moreover, the use of integrated antenna/IC chip packages according to the present invention saves significant space, size, cost and weight, which is a premium for virtually any commercial or military application.

Furthermore, in other exemplary embodiments of the invention, antennas can be constructed having an array of two or more antennas formed on a substrate to provide an antenna with desired directivity for beamforming or beam-steering antenna applications. In general, a directive antenna beam pattern can be obtained using a phased array antenna, wherein the input signal phase to each wire bond antenna is controlled to electronically scan or steer the directive antenna pattern to a desired direction.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

What is claimed is:

1. An antenna device, comprising:
   a substrate having first and second bond pads formed on a surface of the substrate;
   an antenna comprising at least one bond wire as a radiating element, wherein the at least one bond wire has a first end bonded to the first bond pad and a second end bonded to the second bond pad on the surface of the substrate; and
   a metallic shield formed on the surface of the substrate, wherein the metallic shield is disposed between the first and second bond pads on the surface of the substrate and wherein the metallic shield is interposed between the surface of the substrate and at least a portion of the bond wire between the first and second ends thereof.

2. The device of claim 1, further comprising a dielectric material formed on the surface of the substrate, which encapsulates the at least one bond wire.

3. The device of claim 1, further comprising a cover formed over the substrate and antenna.

4. The device of claim 1, wherein the antenna comprises a monopole antenna.

5. The device of claim 1, wherein the antenna comprises a dipole antenna.

6. The device of claim 1, wherein the antenna comprises a loop antenna.

7. The device of claim 1, wherein the antenna comprises an end-fire antenna.

8. The device of claim 1, wherein the antenna comprises an antenna array.

9. The device of claim 1, wherein the at least one bond wire comprises a looped portion above the surface of the substrate.

10. The device of claim 9, wherein the metallic shield is disposed under at least a portion of the looped portion of the bond wire.

11. The device of claim 1, wherein the substrate further comprises a feed network connected to the antenna.

12. The device of claim 11, wherein the feed network comprises an impedance matching network.

13. The device of claim 11, wherein the feed network connects the at least one wire to an integrated circuit of an integrated circuit chip.

14. The device of claim 13, wherein the integrated circuit comprises a receiver, transmitter or transceiver circuit.

15. An integrated communications device, comprising:
    a IC (integrated circuit) chip having first and second bond pads formed on an active surface of the chip;
    an antenna comprising at least one bond wire as a radiating element, wherein the at least one bond wire has a first end bonded to the first bond pad and a second end bonded to the second bond pad on the active surface of the IC chip; and
    a metallic shield formed on the active surface of the IC chip, wherein the metallic shield is disposed between the first and second bond pads on the active surface of the chip and wherein the metallic shield is interposed between the active surface of the chip and at least a portion of the bond wire between the first and second ends thereof.

16. The device of claim 15, further comprising a cover that encapsulates the IC chip and antenna.

17. The device of claim 15, wherein the IC chip comprises an integrated circuit comprising a transceiver, a receiver, or a transmitter.

18. The device of claim 17, wherein the IC chip comprises an antenna feed network that connects the at least one bond wire to the integrated circuit.

19. An IC (integrated circuit) package apparatus, comprising:
   a carrier substrate;
   an IC chip having first and second bond pads formed on an active surface of the chip and having a non-active surface mounted to the carrier substrate;
   an antenna comprising at least one bond wire as a radiating element, wherein the at least one bond wire has a first end bonded to the first bond pad and a second end bonded to the second bond pad on the active surface of the IC chip;
   a metallic shield formed on the active surface of the IC, wherein the metallic shield is disposed between the first and second bond pads on the active surface of the chip and wherein the metallic shield is interposed between the active surface of the chip and at least a portion of the bond wire between the first and second ends thereof; and
   a package cover that encapsulates the IC chip and antenna.

20. The apparatus of claim 19, wherein the antenna comprises a monopole antenna.

21. The apparatus of claim 19, wherein the antenna comprises a dipole antenna.

22. The apparatus of claim 19, wherein the antenna comprises a loop antenna.

23. The apparatus of claim 19, wherein the antenna comprises an end-fire antenna array.

24. The apparatus of claim 19, wherein the antenna comprises an antenna array.

25. The apparatus of claim 19, wherein the IC chip comprises an integrated circuit comprising a transceiver, a receiver, or a transmitter.

26. The apparatus of claim 25, wherein the IC chip comprises an antenna feed network that connects the at least one bond wire to the integrated circuit.

27. The apparatus of claim 19, wherein the antenna comprises at least a second bond wire having a first end bonded on the active surface of the chip and a second end bonded to the carrier substrate.

28. The apparatus of claim 19, wherein the second end of the at least second bond wire is connected to a lead frame of the carrier substrate.

* * * * *